United States Patent [19]

Enemark et al.

[11] 4,149,162

[45] Apr. 10, 1979

[54] BATTERY DISCRIMINATOR CIRCUIT FOR SMOKE DETECTORS

[75] Inventors: Robert B. Enemark, Duxbury; Paul S. Richtarcsik, Whitman, both of Mass.

[73] Assignee: American District Telegraph Company, Jersey City, N.J.

[21] Appl. No.: 808,065

[22] Filed: Jun. 20, 1977

[51] Int. Cl.² .................... G08B 21/00; G08B 17/10
[52] U.S. Cl. .................................. 340/636; 340/630; 250/574
[58] Field of Search .............. 340/237.5, 249, 636, 340/630; 320/48; 324/29.5

[56] References Cited

U.S. PATENT DOCUMENTS

| | | |
|---|---|---|
| 3,500,167 | 3/1970 | Applegate et al. ............. 324/29.5 X |
| 3,846,773 | 11/1974 | Lintelmann et al. ............. 340/237.5 |
| 3,899,732 | 8/1975 | Staby .................................. 324/29.5 |

*Primary Examiner*—John W. Caldwell, Sr.
*Assistant Examiner*—Daniel Myer
*Attorney, Agent, or Firm*—Grover & Meegan

[57] ABSTRACT

A battery powered smoke detector includes a battery powered discriminator circuit which periodically senses the chemistry of the battery represented by its volt-ampere output and internal impedance. An external impedance comparable to the alarm circuit load on the battery is connected in parallel with the battery such as to trigger an alarm when the battery energy delivered through the impedance approaches a level inadequate to drive the alarm.

7 Claims, 1 Drawing Figure

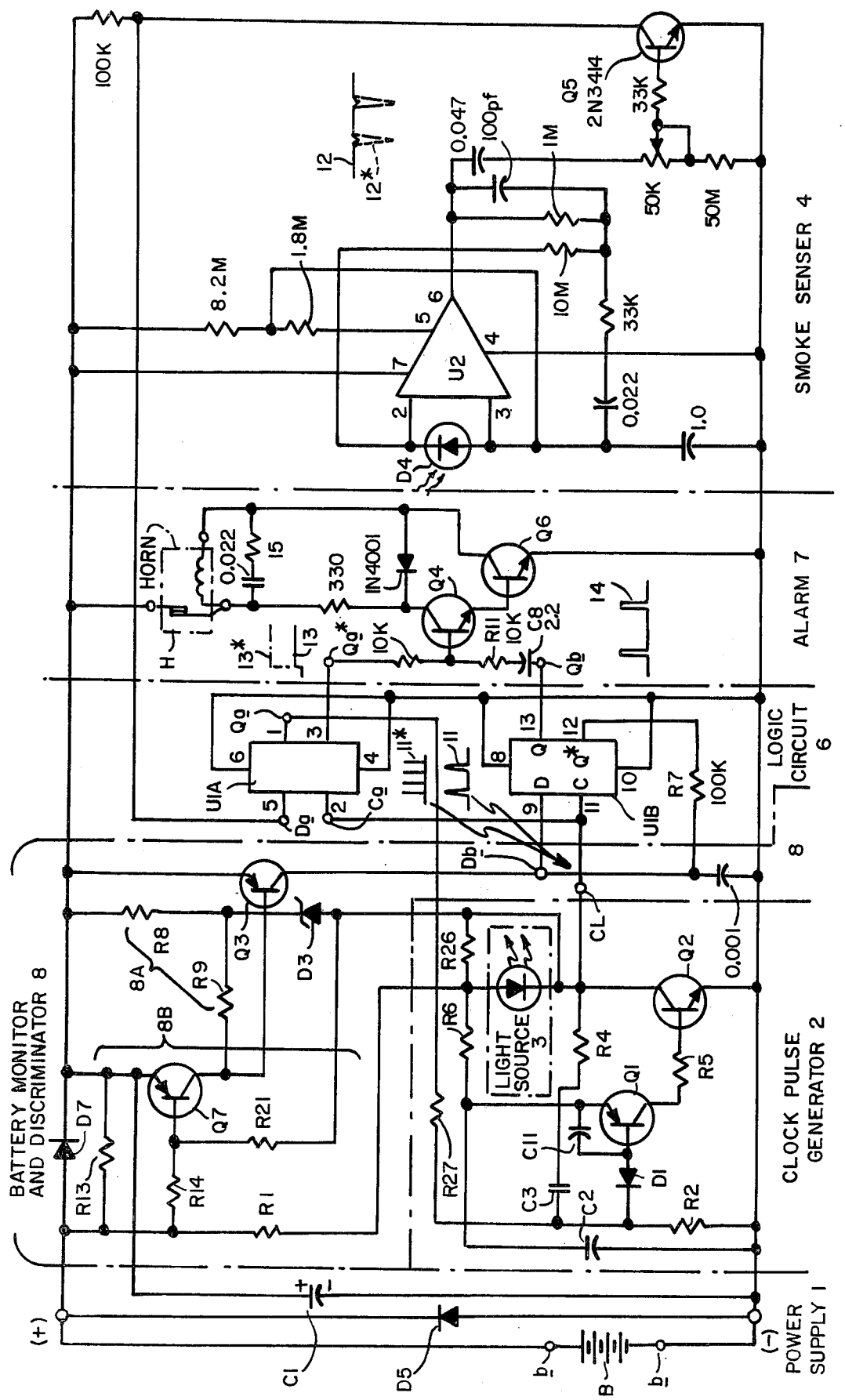

BATTERY DISCRIMINATOR CIRCUIT FOR SMOKE DETECTORS

BACKGROUND OF THE INVENTION

The present invention is an improvement on the copending application of Robert B. Enemark, entitled Battery Powered Smoke Detector, Ser. No. 718,686, filed Aug. 30, 1976, now abandoned and continued in application Ser. No. 872,674, which is incorporated herein by reference. The operation of the detector of that copending application which senses reduced or declining battery voltage only is to be distinguished from the object of the present invention which is to discriminate against batteries whose voltage may be adequate but which are unable to deliver sufficient energy to the smoke detector circuits particularly the detector alarm.

STATEMENT OF INVENTION

According to the invention battery powered alarm apparatus such as an optical or ionization type of smoke or other particle detector comprises power terminals for connection to a battery; means for detecting an alarm condition; alarm means responsive to the detecting means for signalling alarm condition, at least one of the detecting and alarm means being connected as a load across the battery terminals; and means for sensing the battery internal impedance under said load so as to actuate the alarm means when the battery impedance exceeds a preselected value.

DRAWING

The single FIGURE of the drawing is a schematic diagram of an optical smoke detector according to the present invention.

DESCRIPTION

General Description
Power Supply 1
Clock Pulse Generator 2
Light Source 3
Smoke Senser 4
Logic Circuit 6
Alarm 7
Battery Monitor 8A
Battery Discriminator 8B

GENERAL DESCRIPTION

As an example of the invention the FIGURE shows an optical smoke detector of the type in which light from a source 3 is directed through a dark chamber accessible to smoke, the light being directed on a path indicated by arrows, which path is viewed by a photodiode D4 or other photocell of a smoke senser 4 as is well understood and shown in U.S. Pat. No. 3,863,076, for example. Light scattered by smoke or other particles from the path to the photocell excites the photocell and causes the smoke senser 4 to actuate the horn H of an alarm 7 through a logic or alarm control circuit 6. The smoke senser may be of the optical scattering type described, an optical obscuration type, ionization or other type which detects an alarm condition and causes an alarm to signal the condition audibly, visually or as by energizing a relay.

In the detector illustrated the light source 3, senser 4, logic circuit 6 and alarm 7 are powered by a supply including a battery B attached to power terminals b. A clock pulse generator 2 controls periodic supply of energy pulses from the battery B to the light source 3, senser 4, logic 6, and alarm 7 circuits during pulse intervals which are very short compared to each clock period before which they occur. The clock 2 also periodically controls supply of battery energy to circuit 8 including a battery monitor 8A and a battery discriminator 8B which are explained in detail hereafter.

Power Supply 1

The power supply includes a 9 volt battery B connected between the terminals b and a diode D5 (1N4001) which protects the detector circuits by short circuiting the battery if it is connected in incorrect polarity.

Clock Pulse Generator 2

The clock pulse generator 2 is an astable, asymmetrical multivibrator with two transistors Q1 (2N2907) and Q2 (D32H2) whose period between pulses is primarily determined by the discharge time of a 1 microfarad capacitor C3 through a 33 megohm resistor R2 although other impedances in the clock result in a clock period of about 15 seconds. A 100 microfarad capacitor C2 stores energy from the battery B through a 100 ohm resistor R1 and a 12 ohm resistor R6, and in turn repeatedly charges the clock timing capacitor C3 through the emitter-base circuit of the first transistor Q1, a blocking diode D1 (1N4454), a 22 ohm resistor R4 and the collector-emitter circuit of the second transistor Q2. The approximately 140 microsecond duration of each clock pulse is determined by this charging circuit.

Charging of the timing capacitor C3 causes the first transistor Q1 and then the second transistor Q2 to conduct for the pulse duration whereafter their loss of conduction starts the 15 second interpulse period. Conduction by the second clock transistor Q2 produces a negative going clock pulse 11 at the clock output terminal CL and also draws operating current through the LED D2. Of particular significance is that the clock transistor Q2 also draws current through a zener diode in the battery monitor circuit 8A, and through the resistor R1 in the battery discriminator circuit 8B, as described more fully hereafter.

Light Source 3

When conduction by the second clock transistor Q2 also draws operating current through the light emitting diode (LED) D2 of the light source 3, it thereby energizes the LED causing it to emit a light pulse at the beginning of each clock period.

Smoke Senser 4

Smoke in the light path from the LED will scatter light, or in some detectors obscure light, to the photodiode D4 of the smoke senser 4. In either case the photodiode or other photocell will produce a signal proportional to the light alteration by smoke. As the density of smoke increases, the pulsed light from the LED D2 is scattered in greater intensity to the photodiode D4, and its increased output to an operational amplifier U2 is applied to a level detecting transistor Q5 (2N3414). As is explained in the aforementioned application Ser. No. 718,686, the level detector is biased to conduct when the smoke concentration exceeds a predetermined density, for example a density which will attenuate a light beam 2% in one foot. Its collector voltage, previously close to the positive battery voltage as shown by the solid line voltage waveform 12, then drops toward the ground or maximal negative bus voltage (−) with each light pulse as shown by the broken line waveform 12*. This maximal negative smoke detection signal 12* is applied to the data input Da of the logic circuit 6.

Logic Circuit 6

The logic circuit 6 comprises two sections U1A and U1B of an integrated circuit (IC) including a dual data-type flip-flop such as RCA type CD4013AE described in RCA '74 Data Book SSD-2038 *COS/MOS Digital Integrated Circuits*, pages 68 and 69. Substantially in coincidence with the application of detection pulses 12* at the data input Da of the IC section U1A a pulse 11 is normally applied from the clock output CL to the clock input Ca of the same IC section U1A. The coincident application of detection signals 12* and clock pulses 11 cause the IC section U1A to increase its quiescent voltage 13 at its inverse output Q*a to an alarm level 13* as shown in the voltage waveforms adjacent output terminal Q*a. As described more fully in the above mentioned application Ser. No. 718,686 the alarm signal 13* causes two transistors Q4 (2N3414) and Q6 (D32H2) to drive a horn H in the alarm 7. A relay or other alarm output can be substituted for the horn.

Alarm 7

Battery Monitor 8A

The battery voltage monitoring circuit 8A basically comprises two 470 ohm resistors R8 and R9 and a 7 volt zener diode D3 in series with resistor R8. Resistor R8 is connected to the positive battery bus (+) through an isolating diode D7 (1N4001) and the zener diode is connected to the clock terminal CL so that the battery voltage is applied across resistor R8 and the zener diode D3. If the battery voltage is between approximately 7.5 volts and a rated 9 volts, for example, the zener diode will conduct each clock pulse interval applying a voltage through resistor R9 to the base of a monitor transistor Q3 thereby biasing the transistor to conduction during the clock pulse. Conduction of the monitor transistor Q3 raises the voltage at the data input Db of a second section U1b of the dual, data-type flip-flop, and causes the flip-flop output Qb to draw current through a resistor R11 and a capacitor C8 connected to the base of the first alarm transistor Q4. The horn conducts for the charging time of the capacitor C8, about 20 times the length of a clock pulse. As the capacitor C8 charges the first transistor conducts, in turn causing the second alarm transistor C6 to conduct and momentarily drive the horn H only on receipt of the first clock pulse transmitted by the monitor transistor Q3. The capacitor is charged at the occurance of the first succeeding clock pulse, but is discharged through the inverse outputs Q*a and Q* of the first and second flip-flops section U1A and U1B by the time of the second successive clock pulse again allowing the horn to be driven momentarily. Thus the horn sounds a distinctive trouble signal briefly at twice the clock pulse period, thereby doubling the time which the battery can continue the trouble signal.

Battery Discriminator 8B

Dry cell batteries occasionally are defective when new and unused in that they have a high internal impedance and are incapable of delivering their rated current at their rated voltage. While such deficiency might not be noticed immediately in a flashlight, the result in a smoke detector would be that the battery could supply energy to drive the alarm horn only briefly or not at all. Moreover, batteries of the same rated voltage may be chemically different. For example, a 9 volt alkaline battery, NEDA type 1604, which is desirable because of its moderate cost and easy availability, cannot be replaced in electronic circuits like those of a smoke detector with a 9 volt mercuric oxide, carbon zinc or zinc chloride battery because of the difference in chemistry and internal impedance. The discriminator circuit 8B detects such incompatible chemistry or the consequent high impedance of a battery and its inability to deliver energy at its rated voltage and amperage. The operation of the circuit 8B in discriminating against such chemically incompatible batteries is to be distinguished from operation of the circuit 8A which monitors a chemically compatible battery during its normal life and detects its inevitable voltage drop near end life.

The battery discriminator circuit 8B comprises a discriminator transistor Q7 which is normally non-conducting but which when conducting cuts the monitor transistor off. The discriminator circuit 8B thus cooperates with the battery voltage monitor circuit 8A, although each can operate independently. Conduction of the discriminator transistor Q7 is controlled by the voltage on a 450 microfarad storage capacitor C1 connected to the emitter of the transistor Q7, and the current-resistance (IR) drop of a normally 100 ohm resistor R1 coupled to the base of the discriminator transistor through a 1 kilohm resistor R14. The discriminator capacitor C1 is connected in parallel with the battery B but isolated from the battery positive bus (+) by the diode D7 paralleled by a one kilohm leakage resistor R13. The discriminator capacitor C1 stores the battery voltage while the battery is unloaded, that is before the clock pulse draws operating current, and holds that voltage at the emitter of transistor Q7 when the battery is loaded during the clock pulse. At the time of the clock operating current is drained from the battery through the discriminator resistor R1 and the LED D2 in series therewith under control of the clock transistor Q2. The discriminator resistor R1 has approximately the same impedance as the horn H, e.g. 50 to 150 ohms so as to approximate the load placed on the battery during alarm.

As previously stated the discriminator transistor is non-conducting normally that is with a good battery at the terminals b. If the new battery has improper chemistry as indicated by a high, e.g. greater than five ohm, internal impedance, this high impedance will be sensed by the comparison of the battery voltage stored in capacitor C1 at the transistor Q7 emitter with the IR drop of the battery current across the resistor R1. It can be assumed that the battery voltage is near rated voltage, else a voltage deficiency would have been detected by the battery monitor circuit 8A. Thus the increased internal battery impedance alters the ratio between internal resistance and external resistance and reduces the current which the battery can deliver below that needed to operate the horn H. The discriminator transistor Q7 is then caused to conduct and cuts off the monitor transistors so as to cause a trouble alarm signal previously described under the caption Battery Monitor 8A.

It should be understood that the present disclosure is for the purpose of illustration only and that this invention includes all modifications and equivalents which fall within the scope of the appended claims.

We claim:
1. Battery powered alarm apparatus comprising:
   power terminals for connection to a battery;
   means for detecting an alarm condition;
   alarm means responsive to the detecting means for signalling alarm condition, at least one of the detecting and alarm means being connected as a load across the battery terminals; and
   means for sensing the battery internal impedance under load so as to actuate the alarm means when the battery impedance exceeds a preselected value, wherein said battery impedance sensing means comprises:
   a capacitance and means connecting the capacitance substantially directly and non-resistively to the power terminals so that substantially the full battery voltage is stored in the capacitance, and
   means for comparing the stored battery voltage and an IR drop dependent on battery current, the comparing means including respective inputs for the stored voltage and IR drop and an alarm output.

2. Apparatus according to claim 1 wherein the IR drop is produced by an impedance external of the battery and connected across the power terminals.

3. Apparatus according to claim 2 including a clock with switching means connected in series with the impedance for periodically drawing current therethrough.

4. Apparatus according to claim 3 wherein the detecting means includes a light source in series with the external impedance.

5. Apparatus according to claim 2 wherein the external impedance is approximately the same as that of the alarm means.

6. Apparatus according to claim 4 wherein the detecting means includes the light source and a photocell responsive to alteration of light from the source by particles.

7. Apparatus according to claim 1 wherein the capacitance coupling means is a diode.